United States Patent
Sun et al.

(10) Patent No.: US 10,060,581 B2
(45) Date of Patent: Aug. 28, 2018

(54) LIGHT EMITTING DEVICE

(71) Applicant: Genesis Photonics Inc., Tainan (TW)

(72) Inventors: Sheng-Yuan Sun, Tainan (TW); Po-Jen Su, Tainan (TW)

(73) Assignee: Genesis Photonics Inc., Tainan (TW)

( * ) Notice: Subject to any disclaimer, the term of this patent is extended or adjusted under 35 U.S.C. 154(b) by 0 days.

(21) Appl. No.: 15/437,430

(22) Filed: Feb. 20, 2017

(65) Prior Publication Data

US 2017/0159895 A1   Jun. 8, 2017

Related U.S. Application Data

(63) Continuation of application No. 14/715,569, filed on May 18, 2015, now Pat. No. 9,574,721, which is a (Continued)

(30) Foreign Application Priority Data

Apr. 26, 2012   (TW) .............................. 101114933 A

(51) Int. Cl.
*F21K 9/64*   (2016.01)
*F21V 13/02*  (2006.01)
(Continued)

(52) U.S. Cl.
CPC ................. *F21K 9/64* (2016.08); *F21V 9/30* (2018.02); *F21V 13/02* (2013.01);
(Continued)

(58) Field of Classification Search
CPC ... F21K 9/16; F21K 9/56; F21V 13/02; H01L 27/15; H01L 33/20
See application file for complete search history.

(56) References Cited

U.S. PATENT DOCUMENTS 6,297,598 B1 * 10/2001 Wang ................... G02B 6/0068
                                                257/E25.02
6,867,549 B2 * 3/2005 Cok ..................... G09G 3/3216
                                                315/169.3
(Continued)

FOREIGN PATENT DOCUMENTS

CN   1854859    11/2006
CN   102214776  10/2011
(Continued)

OTHER PUBLICATIONS

"Office Action of China Related Application, Application No. 201610905001.X", dated May 31, 2018, p. 1-p. 9.

*Primary Examiner* — Peniel M Gumedzoe
(74) *Attorney, Agent, or Firm* — JCIPRNET

(57) ABSTRACT

A light emitting module including a substrate, a plurality of first light emitting diode (LED) chips and a plurality of second LED chips is provided. The substrate has a cross-shaped central region and a peripheral region surrounding the cross-shaped central region. The first LED chips are disposed on the substrate and at least located in the cross-shaped central region. The second LED chips are disposed on the substrate and at least located in the peripheral region. A size of each second LED chip is smaller than a size of each first LED chip. The number of the first LED chips located in the peripheral region is smaller than that in the cross-shaped central region. The number of the second LED chips located in the cross-shaped central region is smaller than that in the peripheral region.

6 Claims, 3 Drawing Sheets

Related U.S. Application Data continuation of application No. 13/798,126, filed on Mar. 13, 2013, now Pat. No. 9,035,335.

(51) Int. Cl.
| | |
|---|---|
| *F21V 19/00* | (2006.01) |
| *H01L 27/15* | (2006.01) |
| *F21V 9/30* | (2018.01) |
| *H01L 25/075* | (2006.01) |
| *H01L 33/20* | (2010.01) |
| *H01L 33/50* | (2010.01) |
| *F21Y 101/00* | (2016.01) |
| *F21Y 115/10* | (2016.01) |
| *F21Y 113/10* | (2016.01) |

(52) U.S. Cl.
CPC ...... *F21V 19/0025* (2013.01); *H01L 25/0753* (2013.01); *H01L 27/15* (2013.01); *F21Y 2101/00* (2013.01); *F21Y 2113/10* (2016.08); *F21Y 2115/10* (2016.08); *H01L 33/20* (2013.01); *H01L 33/50* (2013.01); *H01L 2924/0002* (2013.01)

(56) References Cited

U.S. PATENT DOCUMENTS

| | | | | |
|---|---|---|---|---|
| 2003/0214725 | A1* | 11/2003 | Akiyama | G09G 3/3413 359/640 |
| 2006/0209538 | A1* | 9/2006 | Chang | G09F 13/22 362/231 |
| 2007/0029915 | A1* | 2/2007 | Kim | G09G 3/3413 313/483 |
| 2007/0146298 | A1* | 6/2007 | Kim | G02F 1/133603 345/102 |
| 2008/0002100 | A1* | 1/2008 | Kaneko | G02F 1/133603 349/65 |
| 2008/0164484 | A1* | 7/2008 | Lee | H01L 25/0753 257/89 |
| 2009/0050908 | A1* | 2/2009 | Yuan | F21K 9/00 257/88 |
| 2010/0109564 | A1* | 5/2010 | Shin | H05B 33/0857 315/294 |
| 2011/0058369 | A1* | 3/2011 | Imamura | H01L 25/0753 362/231 |
| 2011/0115406 | A1* | 5/2011 | Wang | H05B 33/0812 315/294 |
| 2011/0222264 | A1* | 9/2011 | Matsuda | F21K 9/00 362/84 |
| 2011/0278605 | A1* | 11/2011 | Agatani | H01L 25/0753 257/89 |
| 2012/0138978 | A1* | 6/2012 | Tsang | H01L 25/0753 257/89 |
| 2013/0148344 | A1* | 6/2013 | Su | H01L 25/075 362/231 |

FOREIGN PATENT DOCUMENTS

| | | |
|---|---|---|
| CN | 102405372 | 4/2012 |
| CN | 103189980 | 7/2013 |
| TW | 200929392 | 7/2009 |

* cited by examiner

LIGHT EMITTING DEVICE

CROSS-REFERENCE TO RELATED APPLICATION

This application is a continuation application of and claims the priority benefit of U.S. application Ser. No. 14/715,569, filed on May 18, 2015, now allowed. The prior U.S. application Ser. No. 14/715,569 is a continuation application of and claims the priority benefit of U.S. application Ser. No. 13/798,126, filed on Mar. 13, 2013, now patented, issued as U.S. Pat. No. 9,035,335. The prior U.S. application Ser. No. 13/798,126 claims the priority benefit of Taiwan application serial no. 101114933, filed on Apr. 26, 2012. The entirety of each of the above-mentioned patent applications is hereby incorporated by reference herein and made a part of this specification.

BACKGROUND OF THE INVENTION

Technical Field

The invention relates generally to a light emitting module, and more particularly to a light emitting module using a light emitting diode chip as the light source.

Related Art

A light emitting diode (LED) is a light emitting element constituted by a semiconductor material having group III-V elements. The LED has advantages such as long service life, small volume, high shock resistance, low heat output, and low power consumption. Thus, it has been widely utilized in indicators or light sources for household appliances and various instruments. In recent years, the LED has been developed towards multicolor and high brightness; therefore, its application scope has been expanded to large outdoor display boards, traffic signal lights, and the like. In the future, the LED may even become the main illumination light source with both power-saving and environment-protecting functions.

In the designs of conventional LED modules, the light beam emitted by the LED chip is projected directly. In other words, the light beam generated by the LED chip has high directivity, and thus may result in unfavorable light uniformity and glares that would cause discomfort for the user. Moreover, in order to generate the white LED light source, typically a plurality of LED chips of different colors (e.g., red, blue, and green) with the same size are configured in an array on the carrier for packaging. However, as the light from these LEDs is emitted forward directly, a large light mixing area is needed to harmonize the light. The size of the whole LED module is increased as a consequence, which causes inconvenience.

To resolve the aforementioned problems, an optical lens is usually configured in the current LED modules, so that the light beam emitted by the LED chips can be utilized effectively. However, when the LED chips are covered by the optical lens, due to light of different color having different refraction angles with the optical lens, the illumination angle generated by the whole LED illumination module may be too small or focused at a certain region. For example, a part of the red light appears at a specific range, such that the distribution of chroma for the entire illumination regions becomes irregular, and thereby the LED module may have problems such as non-uniform light or low color render index of the light source.

SUMMARY OF THE INVENTION

The invention provides a light emitting device integrating a plurality of light emitting diode (LED) chips of different size, and the light emitting device is capable of improving the problem of non-uniform chroma in the conventional LED module.

A white light emitting device comprises a substrate; a plurality of first light emitting diode (LED) chips, each emitting light of a dominant wavelength in a range from 440 nm to 480 nm, the first LED chips being mounted on and electrically connected to the substrate, and a difference between the dominant wavelengths of at least two first LED chips being greater than or equal to 5 nm; a plurality of second LED chips, each emitting light of a dominant wavelength in a range from 600 nm to 760 nm, the second LED chips being mounted on and electrically connected to the substrate, and a difference between the dominant wavelengths of at least two second LED chips being greater than or equal to 5 nm; and a fluorescent layer, disposed on the substrate, converting a portion of light of the first LED chips to generate a fluorescent light.

A white light emitting device comprises a substrate; a plurality of blue light emitting diode (LED) chips mounted on and electrically connected to the substrate; a plurality of red LED chips mounted on and electrically connected to the substrate, wherein at least one of a difference between at least two of the dominant wavelengths of the blue LED chips and a difference between at least two of the dominant wavelengths of the red LED chips is greater than or equal to 5 nm; and a fluorescent layer, disposed on the substrate, converting a portion of light emitted from the blue LED chips to generate a fluorescent light.

A white light emitting device comprises a substrate at least having one first mounting area and a plurality of second mounting areas, wherein the second mounting areas are spaced apart by the first mounting area; a plurality of first light emitting diode (LED) chips, disposed within the first mounting area, each of the first LED chips emitting light of a dominant wavelength in a range from 440 nm to 480 nm; a plurality of second LED chips, disposed within at least two of the second mounting areas, each of the second LED chips emitting light of a dominant wavelength in a range from 600 nm to 760 nm, wherein at least one of a difference between at least two of the dominant wavelengths of the first LED chips and a difference between at least two of the dominant wavelengths of the second LED chips is greater than or equal to 5 nm, and the first LED chips and the second LED chips are electrically connected to the substrate; and a fluorescent layer, disposed on the substrate, converting light emitted from the first LED chips to generate a fluorescent light.

A light emitting device comprises a plurality of blue light emitting diode (LED) chips; a plurality of red LED chips spaced apart by the blue LED chips, wherein a size of each red LED chip is smaller than a size of each blue LED chip; and at least one fluorescent layer, disposed over the blue LED chips, converting a part of the light emitted from the blue LED chips into a fluorescent light having a wavelength greater than that of the blue light.

In summary, the design of the light emitting device according to some embodiments of the invention disposes a plurality of large size LED chips in the cross-shaped central region, and disposes a plurality of small size LED chips in the peripheral region. Therefore, the corner regions can be effectively used to optimize the utilization rate of the substrate. Moreover, the LED chips with the small size can supplement the chroma performance of the LED chips with the large size. Accordingly, the light emitting device can achieve favorable chroma uniformity.

Several exemplary embodiments accompanied with figures are described in detail below to further describe the disclosure in details.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Figure 1A:
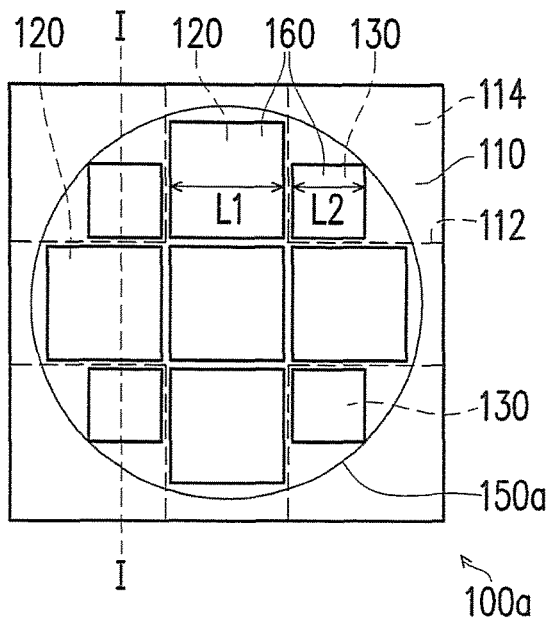
FIG. 1A is a schematic top view of a light emitting module according to an embodiment of the invention.
Figure 1B:
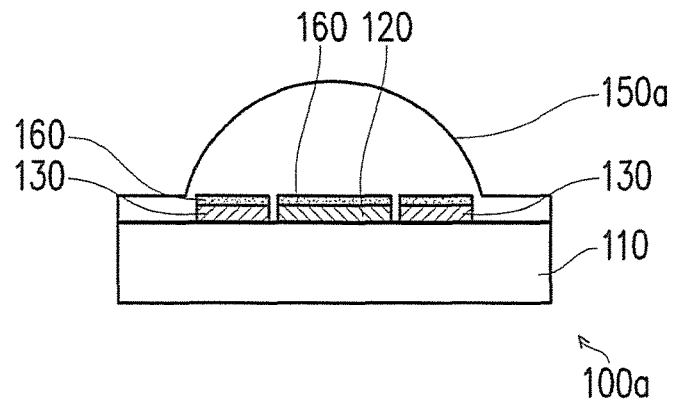
FIG. 1B is a schematic cross-sectional view taken along line I-I in FIG. 1A.

FIG. 1A is a schematic top view of a light emitting module according to an embodiment of the invention. FIG. 1B is a schematic cross-sectional view taken along line I-I in FIG. 1A. With reference to FIGS. 1A and 1B, a light emitting module 100a includes a substrate 110, a plurality of first light emitting diode (LED) chips 120, and a plurality of second LED chips 130.

In more detailed, the substrate 110 has a cross-shaped central region 112 and a peripheral region 114 surrounding the cross-shaped central region 112. The first LED chips 120 are disposed on the substrate 110 and at least located in the cross-shaped central region 112. Herein, the first LED chips 120 are electrically connected to the substrate 110, and the first LED chips 120 are flip-chip LED chips, for example. The second LED chips 130 are disposed on the substrate 110 and at least located in the peripheral region 114. Herein, the second LED chips 130 are electrically connected to the substrate 110, and the second LED chips 130 are flip-chip LED chips, for example.

To be specific, a size of each second LED chip 130 is smaller than a size of each first LED chip 120. The number of the first LED chips 120 located in the peripheral region 114 is smaller than the number of the first LED chips 120 located in the cross-shaped central region 112. Moreover, the number of the second LED chips 130 located in the cross-shaped central region 112 is smaller than the number of the second LED chips 130 located in the peripheral region 114. In other words, a majority of the large size first LED chips 120 is located in the cross-shaped central region 112, and a majority of the small size second LED chips 130 is located in the peripheral region 114. Herein, a length of each first LED chip 120 is L1, a length of each second LED chip 130 is L2, and preferably $L2 \leq L1/\sqrt{2}$.

Specifically, a dominant wavelength of the first LED chips 120 is in a wavelength range of a specific color light. Moreover, the first LED chips 120 are blue LED chips having dominant wavelengths of 440-480 nm. In the present embodiment, a difference between the dominant wavelengths of at least two first LED chips 120 is greater than or equal to 5 nm, such that an inventory issue of the first LED chips 120 can be mitigated and an inventory cost can be reduced. A dominant wavelength of the second LED chips 130 is in a wavelength range of a specific color light. Moreover, the second LED chips 130 are red LED chips having dominant wavelengths of 600-760 nm. In the present embodiment, a difference between the dominant wavelengths of at least two second LED chips 130 is greater than or equal to 5 nm, such that an inventory issue of the second LED chips 130 can be mitigated and an inventory cost can be reduced.

In addition, the light emitting module 100a of the present embodiment further includes a lens 150a and a plurality of fluorescent layers 160. Specifically, the lens 150a is disposed on the substrate 110 and at least covers 70% of a total area occupied by the first LED chips 120 and the second LED chips 130 on the substrate 110. As shown in FIGS. 1A and 1B, the lens 150a in the present embodiment completely covers the first LED chips 120 and the second LED chips 130. An exterior shape of the lens 150a is formed by a circular lens portion and a planar portion, in which the circular lens portion completely covers the first LED chips 120 and the second LED chips 130. The fluorescent layers 160 are respectively and directly disposed on the first LED chips 120 and the second LED chips 130 for enhancing a light emitting efficiency of the first LED chips 120 and the second LED chips 130.

The design of the light emitting module 100a in the present embodiment disposes the large size first LED chips 120 in the cross-shaped central region 112 of the substrate 110, and disposes the small size second LED chips 130 in the peripheral region 114 of the substrate 110. Therefore, the second LED chips 130 (e.g., red LED chips) with the small size and longer wavelengths can supplement a chroma performance of the first LED chips 120 (e.g., blue LED chips) with the large size and shorter wavelengths, and thereby form a white light with favorable uniformity. Accordingly, the light emitting module 100a can achieve favorable chroma uniformity. Furthermore, in the present embodiment, the arrangement of the different sized first LED chips 120 and second LED chips 130 may match a geometric shape of the lens 150a. That is, the smaller second LED chips 130 can be disposed at corner locations on the substrate 110 corresponding to the lens 150a. Accordingly, besides optimizing a utilization rate of the substrate 110 by effectively using the corner regions, the chroma uniformity of the light emitting module 100a can be enhanced.

It should be noted that, the embodiments hereafter adopt the same or similar reference labels used in the previous embodiments to represent the same or the like elements, and the description of the same technical content is omitted. The omitted description can be referenced to the previous embodiments, and so further elaboration thereof is not repeated.

Figure 2:
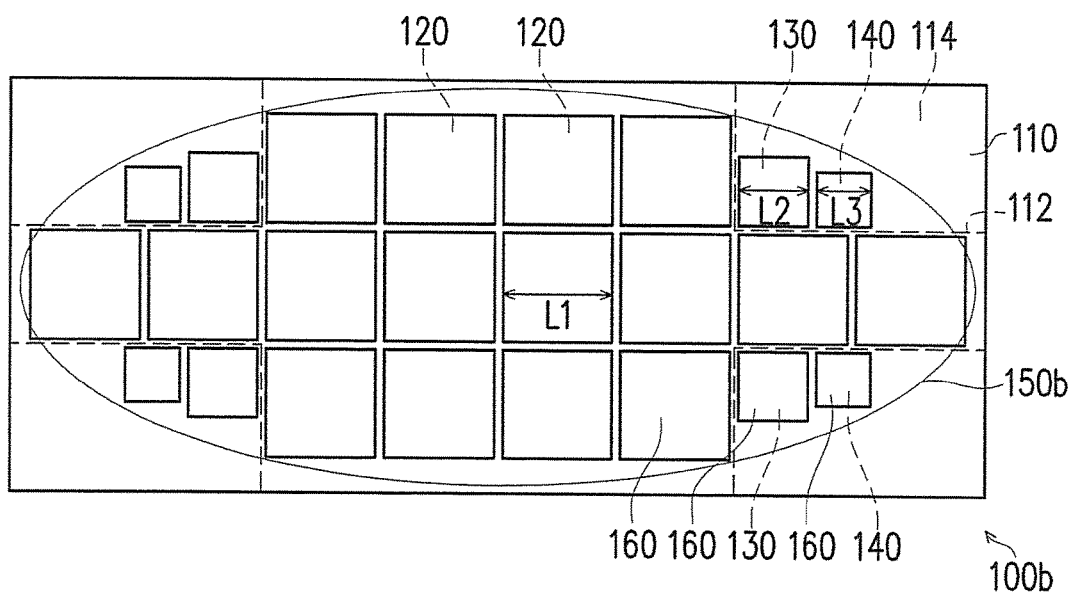
FIG. 2 is a schematic top view of a light emitting module according to an embodiment of the invention.

FIG. 2 is a schematic top view of a light emitting module according to an embodiment of the invention. Referring to FIG. 2, a light emitting module 100b of the present embodiment is similar to the light emitting module 100a depicted in FIG. 1A. A difference between the two light emitting modules resides in that, an exterior shape of a lens 150b of the light emitting module 100b in the present embodiment is oval, and the light emitting module 100b further includes a plurality of third LED chips 140. The third LED chips 140 are disposed on the substrate 110 and at least located in the peripheral region 114. The number of the third LED chips 140 located in the cross-shaped central region 112 of the substrate 110 is smaller than the number of the third LED chips 140 located in the peripheral region 114. In other words, a majority of the third LED chips 140 is located in the peripheral region 114. Herein, the fluorescent layers 160 are directly disposed on the third LED chips 140.

As shown in FIG. 2, the lens 150b in the present embodiment completely covers the first LED chips 120, the second LED chips 130, and the third LED chips 140. A size of each third LED chip 140 is smaller than a size of each second LED chip 130, and the third LED chips 140 are flip-chip LED chips, for example. A length of each first LED chip 120 is L1, a length of each third LED chip 140 is L3, and preferably L3≤L1/2. A dominant wavelength of the third LED chips 140 is in a wavelength range of a specific color light. Moreover, the third LED chips 140 are green LED chips having dominant wavelengths of 500-560 nm. That is, the dominant wavelengths of the third LED chips 140 are longer than the dominant wavelengths of the first LED chips 120. Moreover, a difference between the dominant wavelengths of at least two third LED chips 140 is greater than or equal to 5 nm, such that an inventory issue of the third LED chips 140 can be mitigated and an inventory cost can be reduced.

The design of the light emitting module 100b in the present embodiment disposes a plurality of large size first LED chips 120 in the cross-shaped central region 112 of the substrate 110, and disposes a plurality of small size second LED chips 130 and third LED chips 140 in the peripheral region 114 of the substrate 110. Therefore, the second LED chips 130 (e.g., red LED chips) and the third LED chips 140 (e.g., green LED chips) can supplement a chroma performance of the first LED chips 120 (e.g., blue LED chips). Accordingly, the light emitting module 100b can achieve favorable chroma uniformity. Moreover, besides the arrangement of the first LED chips 120, the second LED chips 130, and the third LED chips 140 optimizing a utilization rate of the substrate 110 by effectively using the corner regions of the substrate 110 corresponding to the lens 150b, the chroma uniformity of the light emitting module 100b can be enhanced.

Figure 3A:
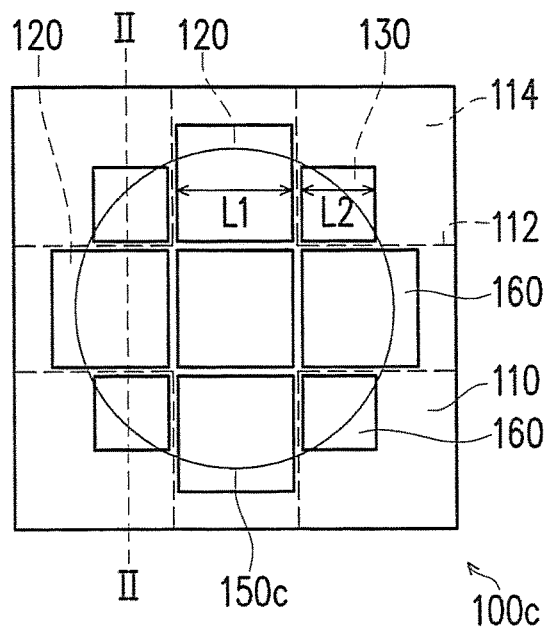
FIG. 3A is a schematic top view of a light emitting module according to an embodiment of the invention.
Figure 3B:
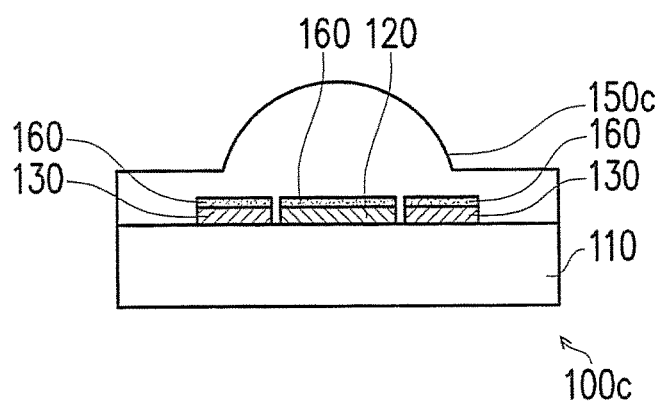
FIG. 3B is a schematic cross-sectional view taken along line II-II in FIG. 3A.

FIG. 3A is a schematic top view of a light emitting module according to an embodiment of the invention. FIG. 3B is a schematic cross-sectional view taken along line II-II in FIG. 3A. Referring to FIGS. 3A and 3B, a light emitting module 100c of the present embodiment is similar to the light emitting module 100a depicted in FIG. 1A. A difference between the two light emitting modules resides in that, a lens 150c of the present embodiment does not completely cover the first LED chips 120 and the second LED chips 130. Specifically, an exterior shape of the lens 150c is formed by a circular lens portion and a planar portion, in which the circular lens portion does not completely cover the first LED chips 120 and the second LED chips 130. The lens 150c at least covers 70% of a total area occupied by the first LED chips 120 and the second LED chips 130 on the substrate 110.

Since a majority of the regions covered by the lens 150c is located in the cross-shaped central region 114 of the substrate 110, which is where the first LED chips 120 are located, therefore, when the area covered by the lens 150c is smaller than the total area occupied by the first LED chips 120 and the second LED chips 130 on the substrate 110, the overall light emitting efficiency and the chroma uniformity of the light emitting module 100c are not affected.

It should be noted that, the exterior shape of the lenses 150a, 150b, and 150c are not limited in invention. Although the exterior shapes of the lenses 150a, 150b, and 150c herein specifically refers to circular and oval shapes, however other known structural designs capable of achieving the same light mixing effect, such as a continuous arc for the exterior shape of the lens, is still a part of the technical proposal of the present application and does not depart from the scope of protection sought by the present application.

In view of the foregoing, the design of the light emitting module according to some embodiments of the invention disposes the large size LED chips in the cross-shaped central region, and disposes the small size LED chips in the peripheral region. Therefore, the LED chips with the small size and longer wavelengths can supplement the chroma performance of the LED chips with the large size and shorter wavelengths. Accordingly, the light emitting module can achieve favorable chroma uniformity. Furthermore, according to some embodiments of the invention, the arrangement of the different sized LED chips may match the geometric shape of the lens. That is, the smaller LED chips can be disposed at corner locations on the substrate corresponding to the lens. Accordingly, besides optimizing the utilization rate of the substrate by effectively using the corner regions, the chroma uniformity of the light emitting module can be enhanced.

Although the invention has been described with reference to the above embodiments, it will be apparent to one of the ordinary skill in the art that modifications to the described embodiment may be made without departing from the spirit of the invention. Accordingly, the scope of the invention will be defined by the attached claims not by the above detailed descriptions.

What is claimed is:

1. A light emitting device, comprising:
   a base;
   a plurality of blue light emitting diode (LED) chips disposed on the base;
   a plurality of red LED chips disposed on the base and spaced apart by the blue LED chips;
   at least one fluorescent layer, disposed over a portion of the blue LED chips, converting a part of the light emitted from the blue LED chips into a fluorescent light having a wavelength greater than that of the blue light; and
   a lens layer, disposed on the base to cover the blue LED chips, the red LED chips and the at least one fluorescent layer; and
   a plurality of green LED chips disposed on the base and spaced apart by the blue LED chips and covered by the lens layer.

2. The light emitting device as claimed in claim 1, wherein a size of each red LED chip is smaller than a size of each blue LED chip.

3. The light emitting device as claimed in claim 1, wherein a quantity of the red LED chips is less than a quantity of the blue LED chips.

4. A light emitting device, comprising:
   a substrate;
   a plurality of blue light emitting diode (LED) chips mounted on and electrically connected to the substrate;
   at least one green LED chip mounted on and electrically connected to the substrate;
   a fluorescent layer, disposed on the substrate, converting a portion of light emitted from the blue LED chips to generate a fluorescent light, and
   a lens layer, disposed on the substrate to cover the blue LED chips, the at least one green LED chip and the fluorescent layer,
   wherein when a quantity of the at least one green LED chip is two or more, areas occupied by the green LED chips are separated by an area occupied by the blue LED chips.

5. The light emitting device as claimed in claim 4, wherein the blue LED chips are flip-chip LED chips.

6. The light emitting device as claimed in claim 4, wherein the at least one green LED chip is a flip-chip LED chip.

* * * * *